United States Patent [19]
Kim

[11] Patent Number: 5,929,668
[45] Date of Patent: *Jul. 27, 1999

[54] DATA OUTPUT BUFFER CIRCUIT

[75] Inventor: Gyu Suk Kim, Kyoungki-do, Rep. of Korea

[73] Assignee: Hyundai Electronice Industries Co., Ltd., Ichon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/966,845

[22] Filed: Nov. 7, 1997

Related U.S. Application Data

[63] Continuation of application No. 08/715,747, Sep. 19, 1996, abandoned, which is a continuation of application No. 08/565,630, Nov. 27, 1995, abandoned, which is a continuation of application No. 08/167,788, Dec. 15, 1993, abandoned.

[30] Foreign Application Priority Data

Dec. 16, 1992 [KR] Rep. of Korea ................. 92-24454

[51] Int. Cl.$^6$ ................................ H03K 19/094
[52] U.S. Cl. ................. 327/112; 327/384; 326/27; 326/87
[58] Field of Search ................. 307/572, 573, 307/575, 576, 577, 579, 584, 585, 540, 542, 542.1, 362, 363, 494, 443, 263, 296.4, 272.3, 358, 360, 354; 327/108, 112, 379, 384, 387, 388; 326/26, 27, 32

[56] References Cited

U.S. PATENT DOCUMENTS

| | | | |
|---|---|---|---|
| 4,638,187 | 1/1987 | Boler et al. | 307/443 |
| 4,792,705 | 12/1988 | Ouyang et al. | 307/296.2 |
| 4,849,654 | 7/1989 | Okada | 307/296.4 |
| 4,855,623 | 8/1989 | Flaherty | 307/475 |
| 4,874,965 | 10/1989 | Campardo et al. | 307/272.3 |
| 5,003,205 | 3/1991 | Kohda et al. | 307/443 |
| 5,015,873 | 5/1991 | Hirayama | 307/362 |
| 5,144,159 | 9/1992 | Frisch et al. | 307/272.3 |
| 5,149,994 | 9/1992 | Neu | 307/362 |
| 5,191,235 | 3/1993 | Hara | 307/362 |
| 5,214,316 | 5/1993 | Nagai | 307/272.3 |

FOREIGN PATENT DOCUMENTS

| | | |
|---|---|---|
| 2-265092 | 10/1990 | Japan . |
| 3-178218 | 8/1991 | Japan . |
| 3-210815 | 9/1991 | Japan . |
| 4-82083 | 3/1992 | Japan . |
| 4-219693 | 8/1992 | Japan . |

*Primary Examiner*—Tuan T. Lam
*Attorney, Agent, or Firm*—Thelen Reid & Priest LLP

[57] ABSTRACT

A data output buffer circuit for rapidly outputting data read from a memory cell of a semiconductor integrated circuit to an external circuitry without generating noise of a high voltage level caused by variation of a voltage includes an input terminal for receiving data, a first current path being connected between a first power supply voltage and an output terminal to be open and closed by the data from the input terminal; a second current path being coupled between a second power supply voltage and the output terminal to be complementarily open and closed by the data from the input terminal, and power supply voltage detector for detecting a potential difference between the first and second power supply voltages, and adjusting the sizes of the first and second current paths in accordance with the detected potential difference to generate an output data with a constant current.

2 Claims, 5 Drawing Sheets

//5,929,668//

DATA OUTPUT BUFFER CIRCUIT

This is a continuation of application Ser. No. 08/715,747, filed on Sep. 19, 1996, which is a continuation of Ser. No. 08/565,630, filed on Nov. 27, 1995, which is a continuation of Ser. No. 08/167,788, filed Dec. 15, 1993, all have been abandoned.

BACKGROUND OF THE INVENTION

1. Field of the Invention

The present invention relates to a data output buffer circuit in a semiconductor memory device for externally outputting data read out from a memory cell, and more particularly to a data output buffer circuit capable of preventing increase of noise and decrease of response speed due to variation of power supply voltage.

2. Description of the Prior Art

General data output buffer circuits used in semiconductor memory devices such as Static Random Access Memories (SRAMs), Dynamic Random Access Memories (DRAMs) and Erasable and Programmable Read-Only Memories (EEPROMs) convert data of complementary metal-oxide-semiconductor (CMOS) logic level read out from a memory cell into data of transistor—transistor logic (TTL) level to output the converted data to an external logic circuit. The data output buffer circuit utilizes a MOS transistor having a large channel width to improve fan-out and response speed.

However, the conventional data output buffer circuit embodied with the MOS transistor having the wider channel has a disadvantage of noise which is increasing as a power supply voltage increases. The increase of noise is resulted from the fact that a voltage of an impulse noise signal is increased and a chattering period is lengthened due to a greater power supply voltage during the switching of the transistor.

In order to prevent the increase of noise due to the increase of the power supply voltage, a data output buffer circuit consisting of MOS transistors having a narrow channel width has been suggested.

The MOS transistor having the narrow channel width can mostly satisfy the response speed at a relatively large power supply voltage, while the response speed is significantly lowered at a relatively low voltage. The response speed of the conventional data output buffer circuit at the low voltage is lowered owing to a voltage of an output signal which is gradually increased or decreased.

SUMMARY OF THE INVENTION

Therefore, it is an object of the present invention to provide a data output buffer circuit capable of preventing increase of noise due to the variation of a power supply voltage, and improving response speed of an output signal to an input signal.

To achieve the above object of the present invention, a data output buffer circuit includes input means for receiving data; a first current path being connected between a first power supply voltage and an output terminal to be open and closed by said data from said input means; a second current path being connected between a second power supply voltage and said output terminal to be complementarily open and closed by said data from said input means; and power supply voltage detecting means for detecting a potential difference between said first and second power supply voltages, and adjusting the sizes of said first and second current paths in accordance with the detected potential difference.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENT

Figure 1:
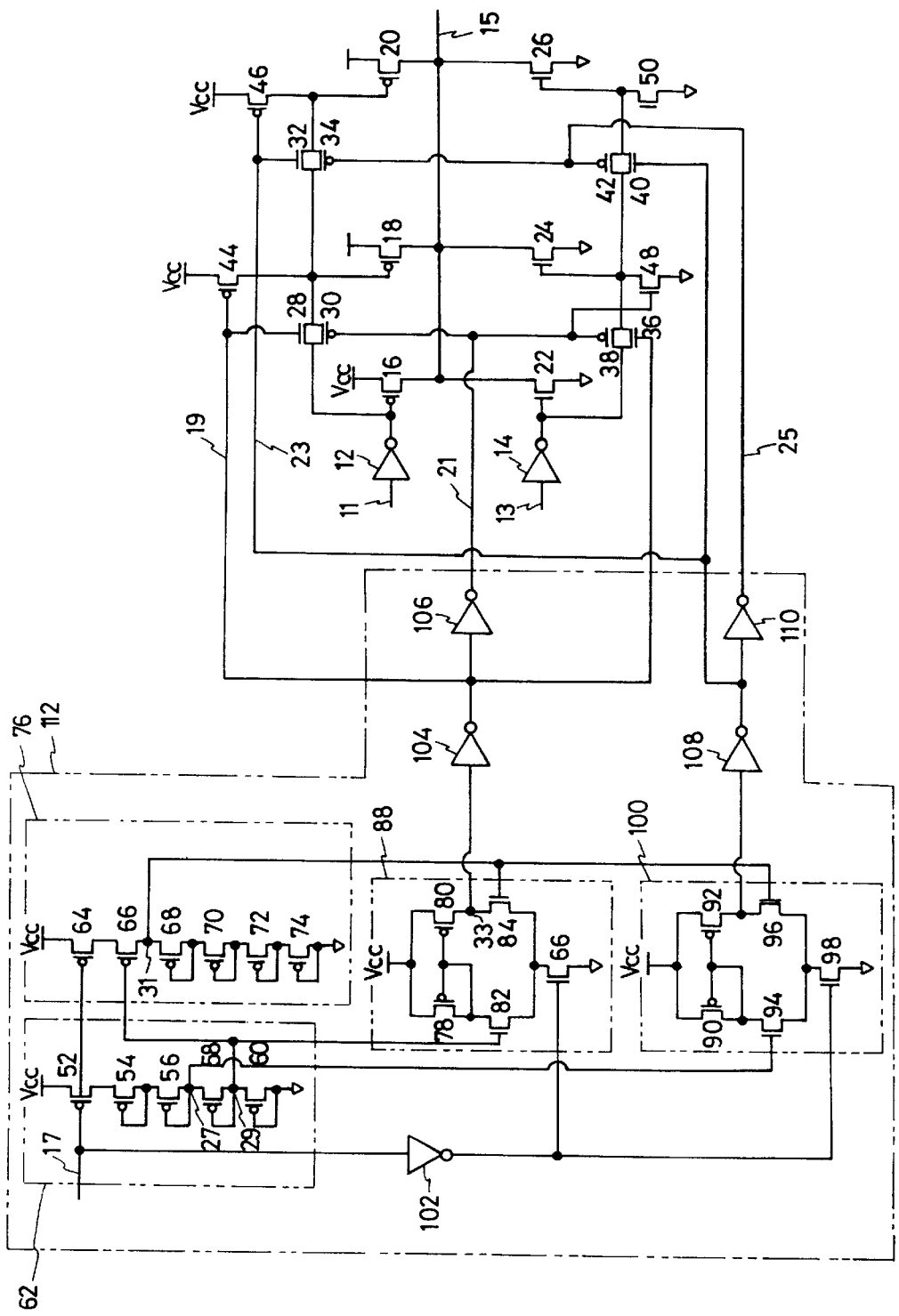
FIG. 1 is a circuit diagram showing an embodiment of a data output buffer circuit according to the present invention.

Referring to FIG. 1, a data output buffer circuit according to the present invention includes a first inverter 12 for inverting true data received via a first input terminal 11, and first to third pull-up PMOS transistors 16~20 connected in parallel between a first power supply voltage source Vcc and an output terminal 15. The first inverter 12 supplies inverted true data to the gate of the first pull-up PMOS transistor 16 and the drains of two MOS transistors 28 and 30 forming a parallel circuit. The NMOS transistor 28 switches the inverted true data which will be transmitted from the first inverter 12 toward the gate of the second pull-up PMOS transistor 18 and the drains of two MOS transistors 32 and 34 forming a parallel circuit, in accordance with the logic state of a first switching control signal supplied from a first control line 19 to the gate of the NMOS transistor 28. In addition, the NMOS transistor 28 forms a first transmission path for the inverted true data when the logic state of the first switching control signal has a high logic, or closes the first transmission path when the first switching control signal has a low logic. Meanwhile, the PMOS transistor 30 forms or closes a second transmission path for the inverted true data, in accordance with the logic state of a second switching control signal supplied from a second control line 21 to the gate of the PMOS transistor 30. The PMOS transistor 30 forms the second transmission path when the second switching control signal has the low logic. The second transmission path connected in parallel with the first transmission path minimizes attenuation of the inverted true data which will be supplied from the first inverter 12 toward the gate of the second pull-up PMOS transistor 20 and the drains of the MOS transistors 32 and 34. The second switching control signal is a complementary signal having a logic value contrary to that of the first switching control signal. The NMOS transistor 32 switches the inverted true data which will be transmitted from the sources of the MOS transistors 28 and 30 toward the gate of the third pull-up PMOS transistor 20 in accordance with the logic state of a third switching control signal supplied from a third control line 23 to the gate of the NMOS transistor 32. Also, the NMOS transistor 32 forms a third transmission path for the inverted true data between the sources of the MOS transistors 28 and 30 and the gate of the third pull-up PMOS transistor 20 when the third switching control signal has the high logic, while closing the third transmission path in response to the third switching control signal of the low logic. Meanwhile, the PMOS transistor 34 forms or closes a fourth transmission path for the inverted true data in accordance with the logic state of a fourth switching control signal supplied from a fourth control line 25 to its gate. In addition to this operation, the PMOS transistor 34 forms the fourth transmission path when the fourth switching control signal has the low logic. The fourth transmission path connected in parallel with the third transmission path minimizes attenuation of the inverted true data which will be supplied from the sources of the MOS transistors 28 and 30 toward the gate of the third pull-up PMOS transistor 20. The fourth switching control signal has a logic value contrary to that of the third switching control signal. The first pull-up PMOS transistor 16 is turned on when the inverted true data from the first inverter 12 goes the low logic, and supplies the first power supply voltage Vcc received by its drain toward the output terminal 15 via its source. The second pull-up PMOS transistor 18 is turned on when the inverted true data of the low logic is supplied from the sources of the MOS transistors 28 and 30 to its gate, and supplies the first power supply voltage Vcc transmitted to its drain toward the output terminal 15 via its source. Moreover, the second pull-up PMOS transistor 18 forms a second current path between the first power supply voltage source Vcc and the output terminal 15 when the inverted true data from the sources of the MOS transistors 28 and 30 has the low logic, thereby improving response characteristic of the output data at the falling edge of the inverted true data. The third pull-up PMOS transistor 20 is turned on when the inverted true data at the low logic state is supplied from the sources of the MOS transistors 32 and 34 to its gate, and supplies the first power supply voltage Vcc received by its drain toward the output terminal 15 via its source. The third pull-up PMOS transistor 20 forms a third current path between the first power supply voltage source Vcc and the output terminal 15 when the inverted true data has the low logic, thereby improving the response characteristic of the output data at the falling edge of the inverted true data. As a result, the second pull-up PMOS transistor 18 and the third pull-up PMOS transistor 20 respectively form the second and third current paths which are connected in parallel with a first current path so as to increase the size of the first current path formed by the first pull-up PMOS transistor 16. In other words, the second and third PMOS transistors 18 and 20 adjust impedance between the first power supply voltage source Vcc and the output line 15 to minimize a transient noise signal level and a chattering period of the output data at the first power supply voltage Vcc of a higher voltage level, and properly maintain the response speed of the output data with respect to the input data. The sizes of the first to third current paths are respectively determined by the channel widths of the first to third pull-up PMOS transistors 16~20. The channel width of the first pull-up PMOS transistor 16 is relatively narrow to minimize the transient noise signal level and the chattering period of the output data, and to properly maintain the response speed of the output data with respect to the input data under at the first power supply voltage Vcc of a higher level. The second and third pull-up PMOS transistors 18 and 20 respectively forming the second and third current paths have relatively narrow channel widths to gradually increase the size of the current path formed between the first power supply voltage Vcc and the output terminal 15.

Furthermore, the data output buffer circuit has a second inverter 14 for inverting complementary data received via a second input terminal 13, and first to third pull-down NMOS transistors 22~26 connected in parallel between a second power supply voltage source GND and the output terminal 15. The second inverter 14 supplies inverted complementary data to the gate of the first pull-down NMOS transistor 22 and the drains of two MOS transistors 36 and 38 forming a parallel circuit. The NMOS transistors 36 switches the inverted complementary data which will be transmitted from the second inverter 14 toward the gate of the second pull-down NMOS transistor 24 and the drains of two MOS transistors 40 and 42 forming a parallel circuit, in accordance with the logic state of the first switching control signal supplied from the first control line 19 to its gate. Also, the NMOS transistor 36 forms a fifth transmission path for the inverted complementary data when the first switching control signal goes the high logic, while closing the fifth transmission path in case of the first switching control signal having the low logic. In the meantime, the PMOS transistor 38 forms or closes a sixth transmission path for the inverted complementary data in accordance with the logic state of the second switching control signal supplied from the second control line 21 to its gate. Also, the PMOS transistor 38 forms the sixth transmission path when the second switching control signal has the low logic. The sixth transmission gate connected in parallel with the fifth transmission path minimizes attenuation of the inverted complementary data which will be transmitted from the second inverter 14 toward the gate of the second pull-down NMOS transistor 24 and the drains of the MOS transistors 40 and 42. The NMOS transistor 40 switches the inverted complementary data which will be transmitted from the sources of the MOS transistors 36 and 38 toward the gate of the third pull-down NMOS transistor 26, in accordance with the logic state of the third switching control signal supplied from the third control line 23 to its gate. The NMOS transistor 40 forms a seventh transmission path for the inverted true data between the sources of the MOS transistors 36 and 38 and the gate of the third pull-down NMOS transistor 26 when the third switching control signal has the high logic, or closes the seventh transmission path when the third switching control signal has the low logic. On the other hand, the PMOS transistor 42 forms or closes an eighth transmission path for the inverted complementary data which path is connected in parallel with the seventh transmission path in accordance with the logic state of the fourth switching control signal supplied from the fourth control line 25 to its gate. The PMOS transistor 42 forms the eighth transmission path when the fourth switching control signal has the low logic. The eighth transmission path connected in parallel with the seventh transmission path minimizes attenuation of the inverted complementary data which will be transmitted from the sources of the MOS transistors 36 and 38 toward the gate of the third pull-down NMOS transistor 26. The first pull-down NMOS transistor 22 is turned on when the inverted complementary data from the second inverter 14 has the high logic to mute a voltage on the output terminal 15 transmitted to its drain toward the second power supply voltage source GND via its source. The second pull-down NMOS transistor 24 is turned on when the inverted complementary data having the high logic is supplied from the sources of the MOS transistors 36 and 38 to its gate to form a fourth current path between the output terminal 15 and the second power supply voltage source GND. The output data from the output terminal 15 has a logic "0" since the voltage excited at the output terminal 15 is muted toward the second power supply voltage GND via the fourth current path. The second pull-down NMOS transistor 24 forms a fifth current path which will be connected in parallel with the fourth current path formed by the first pull-down NMOS transistor 22 when the inverted complementary data from the sources of the MOS transistors 40 and 42 goes the high logic, thereby improving the response characteristic of the output data at the falling edge of the inverted complementary data. The third pull-down NMOS transistor 24 is turned on when the inverted complementary data of the high logic is supplied from the sources of the MOS transistors 40 and 42 to its gate to form a sixth current path which will be connected in parallel with the parallel circuit of the fourth and fifth current paths, thereby improving the response characteristic of the output data at the falling edge of the inverted complementary data. As a result, the second and third pull-down transistors 24 and 26 respectively form the fifth and sixth current paths connected in parallel with the fourth current path so as to widen the width of the fourth current path formed by the first pull-down NMOS transistor 22. In other words, the second and third pull-down NMOS transistors 24 and 26 adjust impedance between the second power supply voltage source GND and the output line 15 to minimize the transient noise signal level and the chattering period of the output data at the first power supply voltage Vcc having the high voltage level and properly maintain the response speed of the output data to the input data. The sizes of the fourth to sixth current paths are respectively determined by the channel widths of the first to third pull-down NMOS transistors 22~26. The channel width of the first pull-down NMOS transistor 22 is relatively narrow to minimize the transient noise signal level and the chattering period at the falling edge of the output data, and properly maintain the response speed of the output data with respect to the input data, in case of the first power supply voltage Vcc having the high voltage level. The second and third pull-down NMOS transistors 24 and 26 respectively forming the fifth and sixth current paths have relatively narrow channel widths to gradually widen the current path formed between the output terminal 15 and the second power supply voltage source GND.

Moreover, the data output buffer circuit includes a PMOS transistor 44 connected between the first power supply voltage source Vcc and the gate of the second pull-up PMOS transistor 18, a PMOS transistor 46 connected between the first power supply voltage source Vcc and the gate of the third pull-up PMOS transistor 20, an NMOS transistor 48 connected between the gate of the second pull-down NMOS transistor 24 and the second power supply voltage source GND, and an NMOS transistor 50 connected between the gate of the third pull-down NMOS transistor 26 and the second power supply voltage source GND. The PMOS transistor 44 supplies the first power supply voltage Vcc to the gate of the first pull-up PMOS transistor 18 in response to the first switching control signal of the low logic supplied from the first control line 19 to its gate to force turning-off of the first pull-up PMOS transistor 18. The PMOS transistor 46 supplies the first power supply voltage Vcc to the gate of the third pull-up PMOS transistor 20 in response to the third switching control signal of the low logic supplied from the third control line 23 to its gate to force turning-off of the third pull-up PMOS transistor 20. Consequently, two PMOS transistors 44 and 46 prevent malfunction of the second and third pull-up PMOS transistors 18 and 20 which may occur by turning off the four MOS transistors 28~34 functioning as control switches. The NMOS transistor 48 supplies the second power supply voltage GND to the gate of the first pull-down NMOS transistor 24 in response to the second switching control signal of the high logic supplied from the second control line 21 to its gate to force turning-off of the first pull-down NMOS transistor 24. The NMOS transistor 50 supplies the second power supply voltage GND to the gate of the third pull-down NMOS transistor 26 in response to the fourth switching control signal of the high logic supplied from the fourth control line 25 to its gate to force turning-off of the third pull-down NMOS transistor 26. As a result, two NMOS transistors 48 and 59 prevent the malfunction of the second and third pull-down NMOS transistors 24 and 26 which may occur due to turning off the four MOS transistors 36~42 which is functioning as control switches.

Also, the data output buffer has a power supply voltage detector 112 for generating the first to fourth switching control signals which detect the voltage level of the first power supply voltage Vcc and control the eight MOS transistors 28~42 serving as the control switches in accordance with the detected voltage level of the power supply voltage. The power supply voltage detector 112 includes a first voltage divider 62 for dividing the first power supply voltage Vcc into two voltages divided by different ratio, a second voltage divider 76 for setting a reference voltage, and first and second differential amplifiers 88 and 100 for comparing the divided voltage from the first voltage divider 62 with the reference voltage from the second voltage divider 76.

Figure 2:
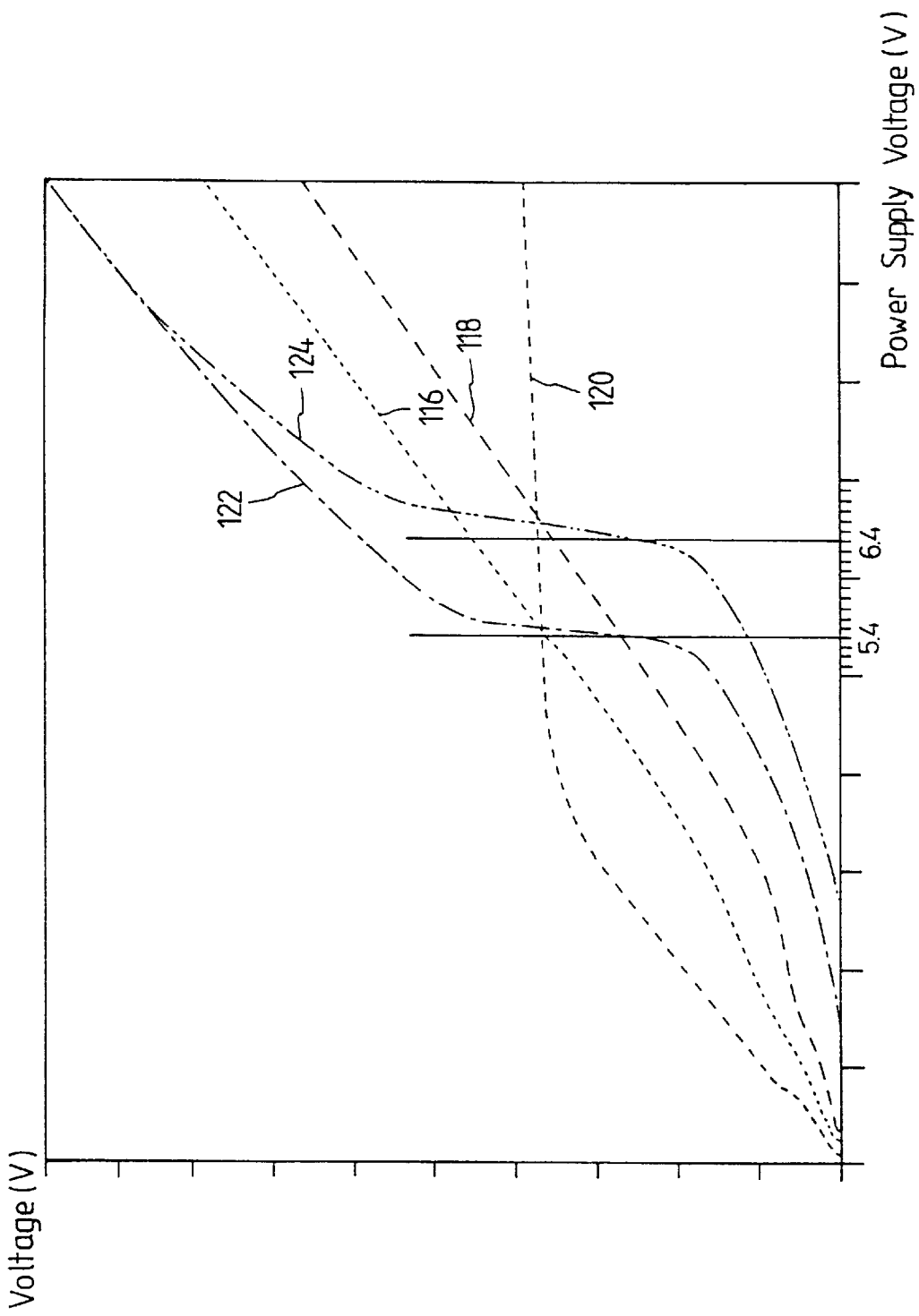
FIG. 2 is a view plotting output characteristics of first and second voltage dividers and first and second differential amplifiers shown in FIG. 1, with respect to variations of a power supply voltage.

The first voltage divider 62 has a PMOS transistor 52 for receiving a chip selection signal from a third input terminal 17 toward its gate, and four PMOS transistors 54~60 serially connected between the source of the PMOS transistor 52 and the second power supply voltage source GND. The PMOS transistor 52 switches the first power supply voltage Vcc which will be transmitted toward the four PMOS transistors 54~60 via its drain and source, in accordance with the logic state of the chip selection signal. The PMOS transistor 52 performing the switching function has a very large channel. The four PMOS transistors 54~60 connecting their gates to their sources divide the voltage from the first power supply voltage source Vcc supplied via the PMOS transistor 52 to generate first and second divided voltage signals which are linearly varied according to the first power supply voltage Vcc. The four PMOS transistors 54~60 has narrow channel widths for producing the divided voltage signals having the linear characteristic. The first divided voltage signal produced at a contact point 27 of the source of the PMOS transistor 56 and the drain of the PMOS transistor 58 is determined by the following equation (1), and has the voltage characteristic as a curve 116 plotted in FIG. 2, which is linearly varied according to the voltage variation of the first power supply voltage Vcc.

$$V27=(R58+R60)Vcc/(R52+R54+R56+R58+R60) \tag{1}$$

In the equation(1), V27 designates the voltage level of the first divided voltage signal, and R52~R60 designate resistance values of the five PMOS transistors 52~60. The second divided voltage signal produced at a contact point 29 of the source of the PMOS transistor 58 and the drain of the PMOS transistor 60 is determined by the following equation (2), and has the voltage characteristic as a curve 118 plotted in FIG. 2, which is linearly varied according to the voltage variation of the first power supply voltage Vcc.

$$V29=R60*Vcc/(R52+R54+R56+R58+R60) \tag{2}$$

In the equation(2), V29 designates the voltage level of the first divided voltage signal.

The second voltage divider 76 is formed of a PMOS transistor 64 for receiving the chip selection signal from the third input terminal 17 toward its gate, a PMOS transistor 66 for receiving the second divided voltage signal from the contact point 29 in the first voltage divider 60 toward its gate, and four PMOS transistors 68~74 serially connected between the drain of the PMOS transistor 66 and the second power supply voltage source GND. The PMOS transistor 64 switches the first power supply voltage Vcc which will be transmitted toward the five PMOS transistors 54~60 via the drain and source of the PMOS transistor 64, in accordance with the logic state of the chip selection signal. The PMOS transistor 64 performing the switching function has a very large channel. The PMOS transistor 66 attenuates the first power supply voltage Vcc supplied to its drain via the drain and the source of the PMOS transistor 64 as the voltage level of the second divided voltage signal from the node 29 is increased, and supplies the attenuated voltage to the serial circuit of four PMOS transistors 68~74. The PMOS transistor 66 has the resistance value linearly increased as the voltage level of the second divided voltage signal is increased. For this property, the PMOS transistor 66 has very narrow channel width. Four PMOS transistors 68~74 having their gates connected to their sources function as fixed resistors, respectively. The five PMOS transistors 66~74 generate the reference voltage having a constant voltage level at a node 31 free from the variation of the first power supply voltage Vcc. The reference voltage at the node 31 between the source of the PMOS transistor 66 and the drain of the PMOS transistor 68, as a curve 120 plotted in FIG. 2, has a linear characteristic at a section that the first power supply voltage Vcc is 0V to 4V, and maintains a constant voltage level at the first power supply voltage Vcc of more than 4V. The reference voltage signal produced at the node 31 is determined by the following equation (3).

$$V31 = \Delta R66 * Vcc/(R68+R70+R72+R74) \qquad (3)$$

In the equation(3), V31 is a reference voltage signal, and ΔR66 and R68~R74 are resistance values of the five PMOS transistors 66~74.

The first differential amplifier 88 compares the second voltage signal from the first voltage divider 62 with the reference voltage signal from the second voltage divider 76 to generate a first comparative signal having the high logic when the voltage level of the second divided voltage signal is higher than that of the reference voltage level signal. The first differential amplifier 88 performs the comparison operation when an inverted chip selection signal supplied from the third input terminal 17 via the third invertor 102 has the high logic. The first comparative signal, as a curve 124 plotted in FIG. 2, has the voltage level of the high logic when the voltage level of the second divided voltage signal exceeds the voltage level (e.g., 3.7V) of the reference voltage signal. On the contrary, the first comparative signal has the voltage level of the low logic when the voltage level of the second divided voltage signal is lower than that of the reference voltage signal. In more detail, The first comparative signal has the high logic when the first power supply voltage Vcc exceeds 6.4V, or has the low logic when the first power supply voltage Vcc has the voltage level below 6.4V. And the first differential amplifier 88 includes an NMOS transistor 82 for receiving the second divided voltage signal from the node 29 in the first voltage divider 62 toward its gate, and an NMOS transistor 84 for receiving the reference voltage signal from the node 31 in the second voltage divider 76 toward its gate. The NMOS transistor 82 increases amount of current flowing from the first power supply voltage Vcc toward the drain of the NMOS transistor 86 via the drain and source of the PMOS transistor 78 and the drain and source of the NMOS transistor 82 as the voltage level of the second divided voltage signal is increased. Meanwhile, the NMOS transistor 84 decreases the amount of current received from the first power supply voltage source Vcc to the drain of the NMOS transistor 86 via the drain and source of the PMOS transistor 80 and the drain and source of the NMOS transistor 84 as the amount of current flowing through the NMOS transistor 82 is increased and thereby increases the voltage level of the first comparative signal which will be supplied to the fourth invertor(104). Also, the NMOS transistor 84 abruptly decreases amount of current flowing through its drain and source when the voltage level of the second divided voltage signal has the same voltage level with the reference voltage signal, thereby altering the logic voltage of the first comparative signal from the low logic to the high logic. The PMOS transistors 78 and 80 having their gates commonly connected to the drain of the NMOS transistor 82 are used as load resistors of the NMOS transistors 82 and 84. The NMOS transistor 86 is turned on when the inverted chip selection signal supplied to its gate has the high logic to transmit a current signal from the sources of the NMOS transistors 82 and 84 toward the second power supply voltage source GND. The NMOS transistor 86 constantly maintains the amount of current flowing toward the second power supply voltage source GND. A fourth inverter 104 inverts and buffers the first comparative signal from a node 33 of the source of the PMOS transistor 80 and the drain of the NMOS transistor 84, and supplies the inverted and buffered first comparative signal as the first switching control signal to the NMOS transistors 28 and 36 and the gates of the PMOS transistor 44 via the first control line 19. The first switching control signal has the high logic from the moment the first power supply voltage Vcc exceeds 6.4V. The fifth inverter 106 for receiving the first switching control signal from the fourth inverter 104 inverts the first switching control signal, and supplies the inverted first switching control signal as the second switching control signal to the gate of the NMOS transistor 48 and the gates of the PMOS transistors 30 and 38 via the second control line 21. Two NMOS transistors 28 and 36 and PMOS transistor 44 driven by the first switching control signal, and the NMOS transistor 48 and two PMOS transistors 30 and 38 driven by the second switching control signal turn off the second pull-up PMOS transistor 18 and the second pull-down NMOS transistor 24 from the moment the first power supply voltage Vcc exceeds 6.4V to allow the channel widths of the first pull-up PMOS transistor 16 and the first pull-down NMOS transistor 22 to have the minimum. If the first power supply voltage Vcc has the voltage level below 6.4V, the second pull-up PMOS transistor 18 and the second pull-down NMOS transistor 24 are turned on to increase the channel widths of the first pull-up PMOS transistor 16 and the first pull-down NMOS transistor 22 in the middle value.

On the other hand, the second differential amplifier 100 compares the first divided voltage signal from the first voltage divider 62 with the reference voltage signal from the second voltage divider 76 to generate a second comparative signal having the high logic when the voltage level of the first divided voltage signal is higher than that of the reference voltage signal. Also, the second differential amplifier 100 performs the comparison operation when the inverted chip selection signal from the third inverter 102 has the high logic. The second comparative signal, as a curve 122 plotted in FIG. 2, has the voltage level of the high logic from the moment the voltage level of the first divided voltage signal exceeds the voltage level (e.g., 3.7V) of the reference voltage signal. Contrarily, the second comparative signal has the voltage level of the low logic when the voltage level of the first divided voltage signal is lower than that of the reference voltage signal. In other words, the second comparative signal has the high logic when the first power supply voltage Vcc exceeds 5.4V, and the low logic when the first power supply voltage Vcc has the voltage level below 5.4V. In order to secure this pattern, the second differential amplifier 100 is formed of two PMOS transistors 90 and 92, and three NMOS transistors 94~98, constructed in the same form as the first differential amplifier 88. The five MOS transistors 90~98 embodying the second differential amplifier 100 function as the same as the five MOS transistors 78~86 included in the first differential amplifier 88, whose descriptions will thus be omitted. The second differential amplifier 100 supplies the second comparative signal to a sixth inverter 108. The sixth inverter 108 inverts and buffers the second comparative signal from the second differential amplifier 100, and supplies the inverted and buffered second comparative signal as the third switching control signal to the gates of the NMOS transistors 32 and 40 and the gate of the PMOS transistor 46 via the third control line 23. The third switching control signal has the high logic from the moment the first power supply voltage Vcc exceeds 5.4V. A seventh inverter 110 for receiving the third switching control signal from the sixth inverter 108 inverts the third switching control signal, and supplies the inverted third switching control signal as the fourth switching control signal to the gate of the NMOS transistor 50 and the gates of the PMOS transistors 34 and 42 via the fourth control line 25. Two NMOS transistors 32 and 40 and PMOS transistor 46 driven by the third switching control signal, and NMOS transistor 50 and two PMOS transistors 34 and 42 driven by the fourth switching control signal turn off the third pull-up PMOS transistor 20 and the third pull-down NMOS transistor 26 from the moment the first power supply voltage Vcc exceeds 5.4V to allow the channel widths of the first pull-up PMOS transistor 16 and the first pull-down NMOS transistor 22 to have the middle value. If the first power supply voltage Vcc has the voltage level below 5.4V, the third pull-up PMOS transistor 20 and the third pull-down NMOS transistor 26 are turned on, thereby increasing the channel widths of the first pull-up PMOS transistor 16 and the first pull-down NMOS transistor 22 in the maximum value.

As a result, the power supply voltage detector 112 drives the second and third pull-up PMOS transistors 18 and 20 and the second and third pull-down NMOS transistors 24 and 26 according to the variation of the first power supply voltage Vcc to adjust the size of the current path formed between the first power supply voltage source Vcc and the output terminal 15 and the size of the current path (i.e., the impedance) between the output terminal 15 and the second power supply voltage source GND. By adjusting the size of the current path between the first power supply voltage source Vcc and the output terminal 15 and that between the output terminal 15 and the second power supply voltage source GND, the response speed of the output data on the output terminal 15 with respect to the input data has a constant value free from the first power supply voltage Vcc. The current path between the first power supply voltage source Vcc and the output terminal 15, and that between the output terminal 15 and the second power supply voltage source GND have the maximum size when the first power supply voltage Vcc has a voltage level lower than 5.4V, and have the minimum size when the first power supply voltage Vcc has a voltage level exceeding 6.4V. Also, the current signal flowing through the current path between the first power supply voltage source Vcc and the output terminal 15, and that between the output terminal 15 and the second power supply voltage source GND maintains an almost constant amount even though the first power supply voltage Vcc is varied. By constantly maintaining the amount of current flowing between the power supply voltage source and the output terminal 15, the output data from the output terminal 15 includes no impulse noise having a high voltage level, and the chattering period of the noise signal included in the output data is minimized.

Figure 3A:
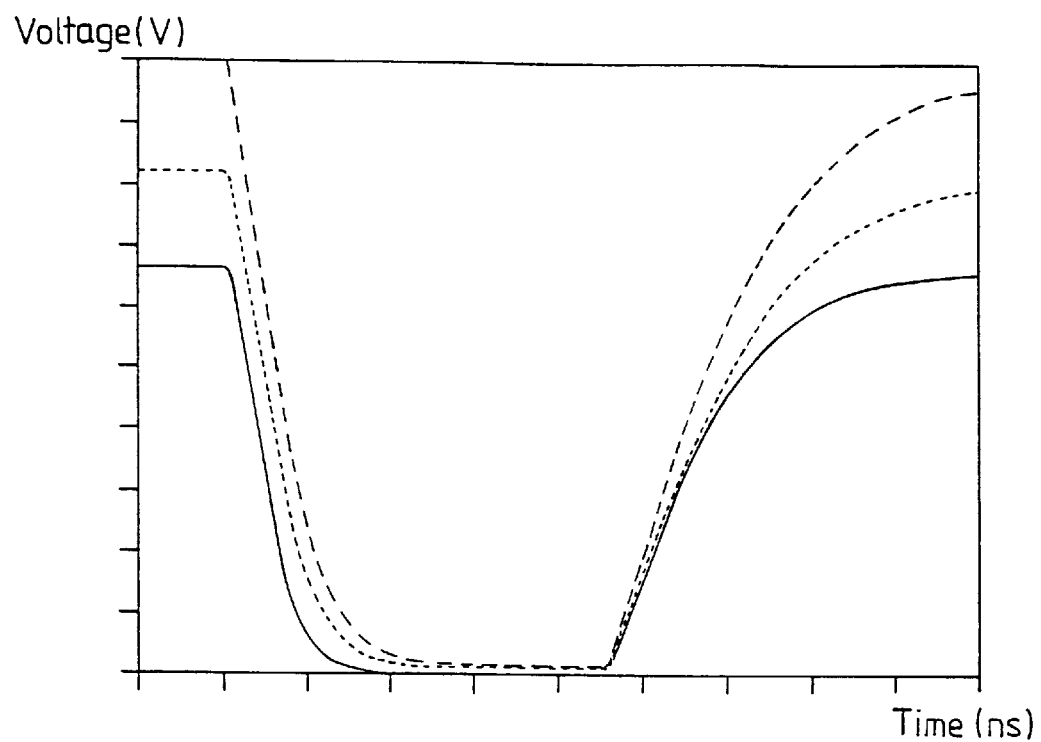
FIGS. 3A and 3B are views plotting distribution curves of the voltage and current characteristics of an output signal versus time when the output signal of the data output buffer circuit embodying the present invention is transited.
Figure 4A:
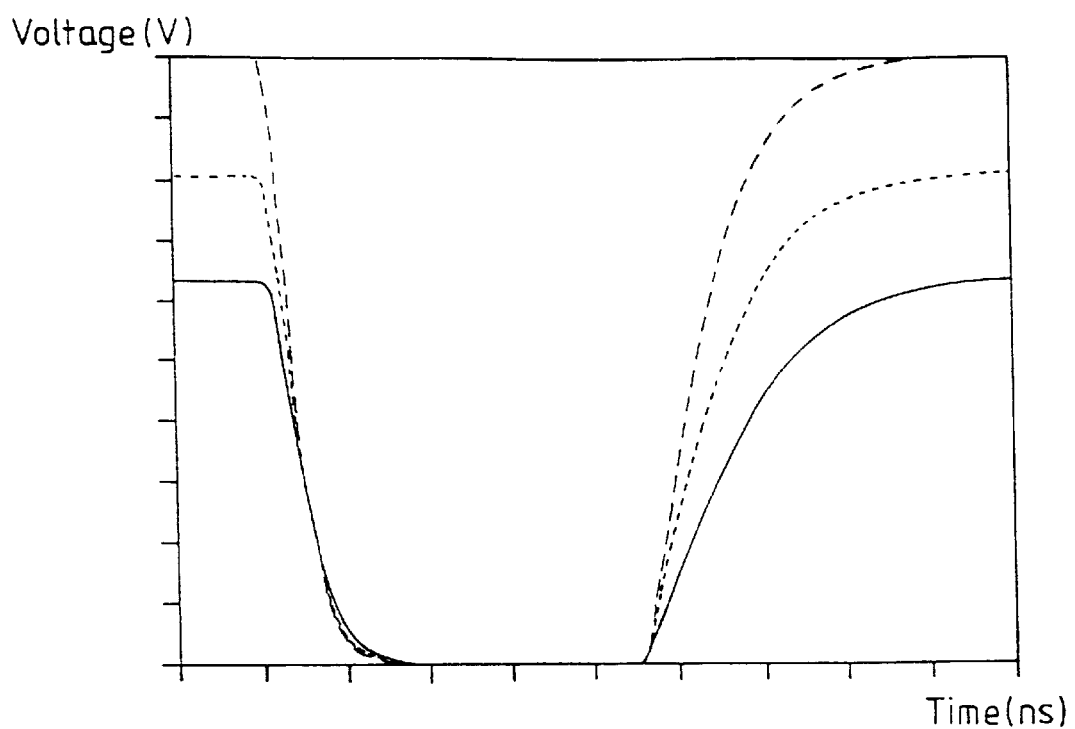
FIGS. 4A and 4B are views plotting distribution curves of the voltage and current characteristics versus time when the output signal of a conventional data output buffer circuit provided with MOS transistors having a large channel width is transited.

FIG. 3A represents a voltage response characteristic of the output data from the data output buffer circuit according to the present invention in accordance with the variation of the power supply voltage. FIG. 4A represents a voltage response characteristic of the output data from a conventional data output buffer circuit in accordance with the variation of the power supply voltage. As shown in FIGS. 3A and 4A, the voltage of the output data from the data output buffer circuit according to the present invention is greatly varied according to the power supply voltage, which is similar to that from the conventional data output buffer circuit.

Figure 3B:
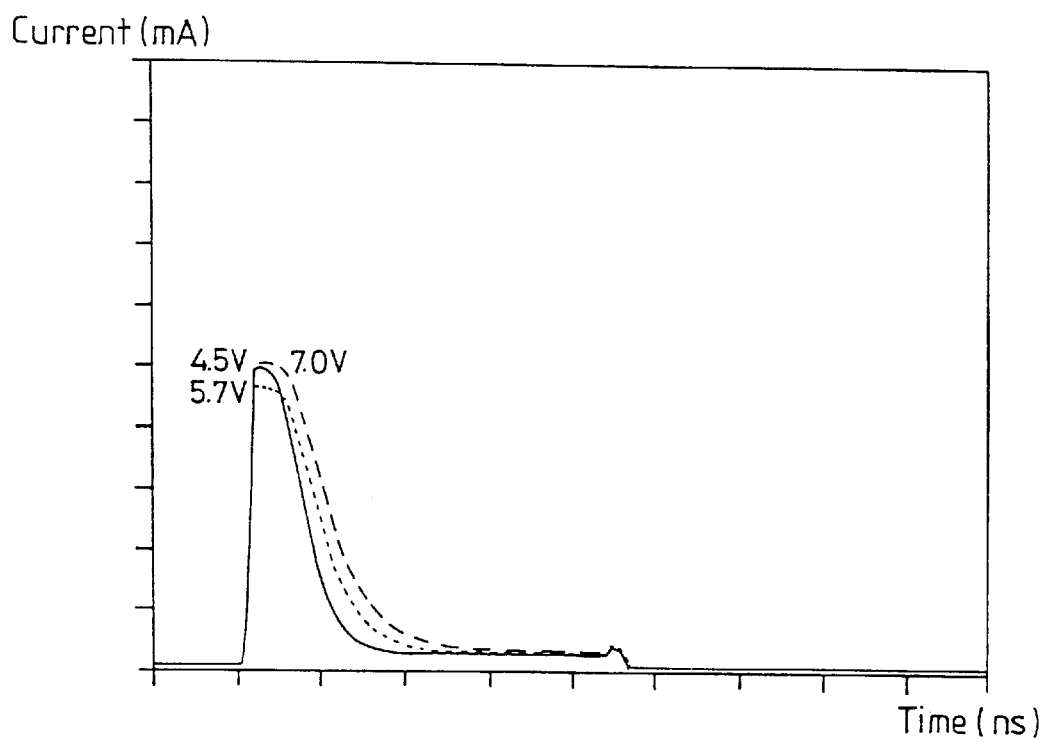
Figure 4B:
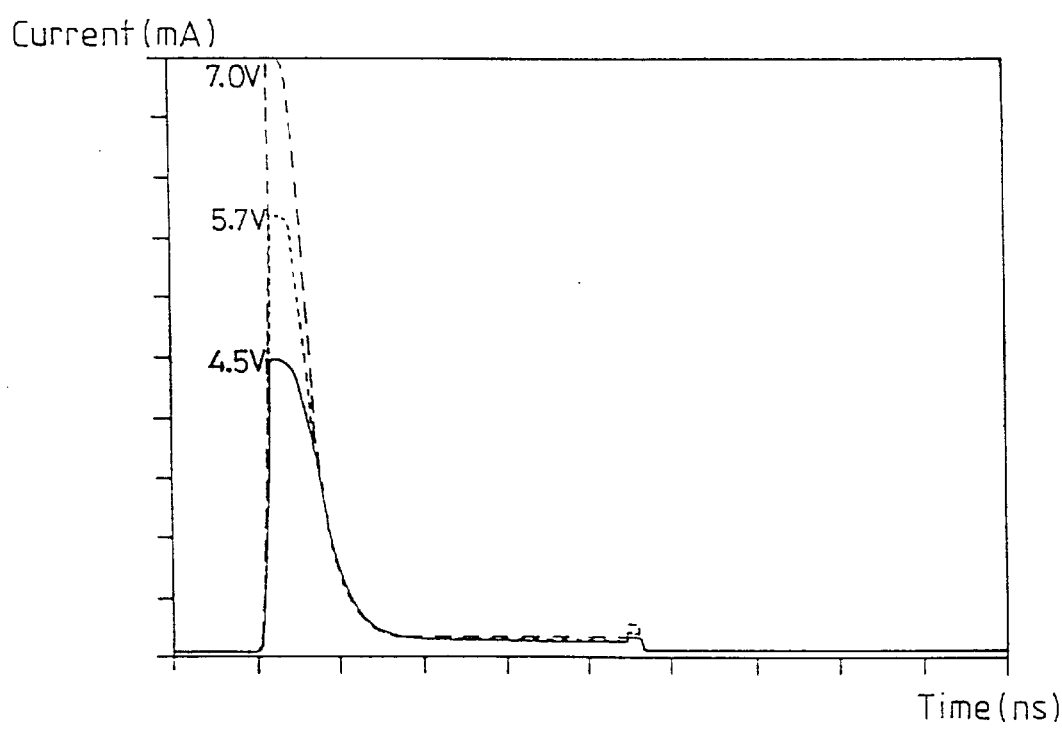

FIG. 3B illustrates a current response characteristic of the output data from the data output buffer circuit according to the present invention in accordance with the variation of the power supply voltage. FIG. 4B illustrates a current response characteristic of the output data from the conventional data output buffer circuit in accordance with the variation of the power supply voltage. As shown in FIGS. 3B and 4B, while the current of the output data from the data output buffer circuit according to the present invention has a maximum constant value, that from the conventional data output buffer circuit is greatly varied in accordance with the power supply voltage.

According to the data output buffer circuit as described above, the size of a current path formed between a power supply voltage and an output terminal is adjusted in response to the variation of the power supply voltage, thereby constantly maintaining current of the output data and improving response speed of the output data to the input data at a low power supply voltage. Since the current of the output data is constantly maintained, the data output buffer circuit according to the present invention prevents occurrence of an impulse noise signal of a high voltage level, and minimizes noise signals included in the output data. By preventing the generation of the impulse noise of the high voltage, the present invention can decrease damage and failure rate of highly-integrated semiconductor devices.

Figure 5:
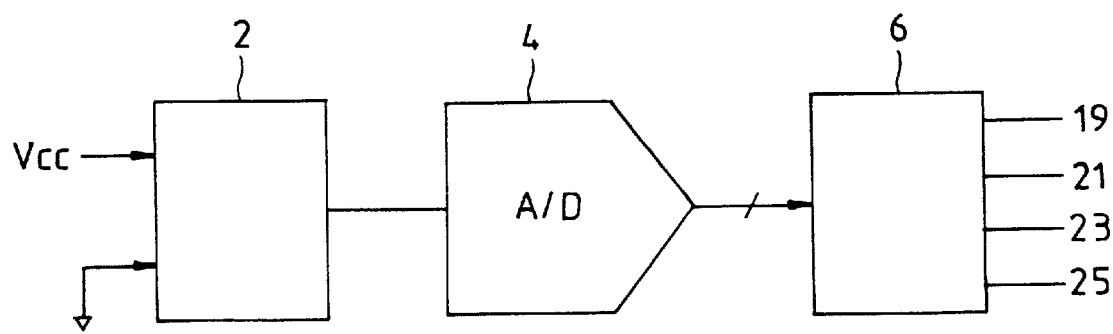
FIG. 5 shows a functional block diagram of a power supply detector, in accordance with an embodiment of the present invention.

While the present invention has been particularly shown and described with reference to a particular embodiment of a data output buffer circuit shown in FIG. 1, it will be understood by those skilled in the art that various changes in form and details may be effected without departing from the spirit and scope of the invention. For example, the power supply voltage detector shown in FIG. 1 may be embodied, as shown in FIG. 5, by a voltage attenuating unit 2 for attenuating the power supply voltage by a predetermined ratio, an analog-to-digital converter 4 for converting the attenuated power supply voltage to a digital signal form, and an decoding unit 6 for generating first to fourth switching control signals by the converted digital power supply voltage signal. Therefore, the spirit and scope of the present invention will be defined by the appended claims.

What is claimed is:

1. A data output buffer circuit, comprising:
   first voltage dividing means for outputting a first voltage and a second voltage, the first voltage corresponding to the variation of a power supply voltage, the second voltage higher than the first voltage;

second voltage dividing means for outputting a reference voltage and responsive to said power supply voltage;

first comparison means for outputting a first comparison signal by comparing the first voltage with the reference voltage;

second comparison means for outputting a second comparison signal by comparing the second voltage with the reference voltage;

first to third pull-up means connected between said power supply voltage and an output terminal for receiving a data signal;

first to third pull-down means connected between the output terminal and a ground voltage for receiving complementary of the data signal;

wherein the first voltage dividing means, the second voltage dividing means, the first comparison means and the second comparison means are controlled by a common control signal;

wherein the first pull-up means and the first pull-down means are operated when the data signal and the complementary data signal are input; and wherein the second pull-up means and the second pull-down means are controlled by the first comparison signal, and the third pull-up means and the third pull-down means are controlled by the second comparison signal.

2. A data output buffer circuit as set forth in claim 1, wherein:

the variation of the power supply voltage is discriminated between a first standard voltage level and a second standard voltage level which is higher than the first standard voltage level;

the second pull-up means, the second pull-down means, the third pull-up means and the third second pull-down means are operated when the level of the power supply voltage is lower than the first standard voltage level;

the second pull-up means and the second pull-down means are operated, and the third pull-up means and the third pull-down means are not operated, when the level of the power supply voltage is higher than the first standard voltage level and lower than the second standard voltage level; and the second pull-up means, the second pull-down means, the third pull-up means and the third pull-down means are not operated, when the level of the power supply voltage is higher than the second standard voltage level.

* * * * *